(12) United States Patent
Hao et al.

(10) Patent No.: US 10,230,018 B2
(45) Date of Patent: Mar. 12, 2019

(54) SUBSTRATE USED FOR III-V-NITRIDE GROWTH AND MANUFACTURING METHOD THEREOF

(71) Applicant: CHIP FOUNDATION TECHNOLOGY LTD., Shanghai (CN)

(72) Inventors: Maosheng Hao, Shanghai (CN); Genru Yuan, Shanghai (CN); Ming Xi, Shanghai (CN); Yue Ma, Shanghai (CN)

(73) Assignee: CHIP FOUNDATION TECHNOLOGY LTD., Shanghai (CN)

( * ) Notice: Subject to any disclaimer, the term of this patent is extended or adjusted under 35 U.S.C. 154(b) by 0 days.

(21) Appl. No.: 15/035,274

(22) PCT Filed: Nov. 6, 2014

(86) PCT No.: PCT/CN2014/090415
§ 371 (c)(1),
(2) Date: Aug. 25, 2016

(87) PCT Pub. No.: WO2015/067183
PCT Pub. Date: May 14, 2015

(65) Prior Publication Data
US 2016/0359082 A1 Dec. 8, 2016

(30) Foreign Application Priority Data
Nov. 7, 2013 (CN) .......................... 2013 1 0548758

(51) Int. Cl.
*H01L 33/00* (2010.01)
*H01L 33/20* (2010.01)
(Continued)

(52) U.S. Cl.
CPC ...... *H01L 33/0066* (2013.01); *H01L 21/0254* (2013.01); *H01L 21/02513* (2013.01);
(Continued)

(58) Field of Classification Search
CPC ............... H01L 33/0066; H01L 33/007; H01L 33/0075; H01L 33/12; H01L 33/18;
(Continued)

(56) References Cited

U.S. PATENT DOCUMENTS 8,222,654 B2 7/2012 Lee
8,492,745 B2 7/2013 Li et al.
(Continued)

FOREIGN PATENT DOCUMENTS

CN 1571175 A 1/2005
CN 101069290 A 11/2007
(Continued)

OTHER PUBLICATIONS

Feb. 17, 2015 Search Report issued in International Patent Application No. PCT/CN2014/090415.

*Primary Examiner* — Cuong Q Nguyen
*Assistant Examiner* — Tong-Ho Kim
(74) *Attorney, Agent, or Firm* — Oliff PLC

(57) ABSTRACT

A substrate used for III-V-nitride growth and a manufacturing method thereof, the manufacturing method including the following steps: 1) providing a growth substrate, and forming on the surface of the growth substrate a buffer layer used for subsequent growth of a luminescent epitaxial structure; 2) forming a semiconductor dielectric layer on the surface of the buffer layer; 3) by a photolithography process, etching a plurality of semiconductor dielectric protrusions arranged at intervals on the semiconductor dielectric layer, and exposing the buffer layer between the semiconductor dielectric protrusions. This method ensures the crystal quality of the grown luminescent epitaxial structure and also raises the luminescent efficiency of a light-emitting diode. The process is simple, advantageous for reducing cost of manufacture, and suitable for use in industrial production.

8 Claims, 3 Drawing Sheets

(51) Int. Cl.
  *H01L 33/18* (2010.01)
  *H01L 33/32* (2010.01)
  *H01L 33/12* (2010.01)
  *H01L 21/02* (2006.01)
  *H01L 33/22* (2010.01)

(52) U.S. Cl.
  CPC ........ *H01L 33/007* (2013.01); *H01L 33/0075* (2013.01); *H01L 33/12* (2013.01); *H01L 33/18* (2013.01); *H01L 33/20* (2013.01); *H01L 33/32* (2013.01); *H01L 33/22* (2013.01); *H01L 2933/0033* (2013.01)

(58) Field of Classification Search
  CPC . H01L 33/20; H01L 33/22; H01L 2933/0033; H01L 21/02513; H01L 21/0254; H01L 33/32
  USPC .......................................... 257/77, 94; 438/47
  See application file for complete search history.

(56) References Cited

U.S. PATENT DOCUMENTS

| | | | |
|---|---|---|---|
| 8,558,258 B2 | 10/2013 | Lee | |
| 2001/0035534 A1* | 11/2001 | Takeya | H01L 33/007 257/189 |
| 2005/0093099 A1* | 5/2005 | Koike | H01L 33/007 257/615 |
| 2005/0148169 A1* | 7/2005 | Frost | G03F 7/40 438/637 |
| 2005/0179130 A1* | 8/2005 | Tanaka | H01L 21/0237 257/730 |
| 2009/0166649 A1* | 7/2009 | Lee | H01L 33/007 257/94 |
| 2010/0084742 A1* | 4/2010 | Sazawa | H01L 29/78 257/615 |
| 2010/0102307 A1* | 4/2010 | Chua | C30B 25/02 257/43 |
| 2012/0138947 A1 | 6/2012 | Li et al. | |
| 2012/0248411 A1 | 10/2012 | Lee | |
| 2013/0020594 A1* | 1/2013 | Ahn | H01L 33/007 257/88 |
| 2013/0048941 A1 | 2/2013 | Yu et al. | |
| 2013/0256743 A1* | 10/2013 | Okuno | H01L 29/2003 257/103 |

FOREIGN PATENT DOCUMENTS

| | | |
|---|---|---|
| CN | 102130245 A | 7/2011 |
| CN | 102485944 A | 6/2012 |
| CN | 102969424 A | 3/2013 |

* cited by examiner

SUBSTRATE USED FOR III-V-NITRIDE GROWTH AND MANUFACTURING METHOD THEREOF

BACKGROUND OF THE PRESENT INVENTION

Field of Invention

The invention relates to the field of semiconductor illumination, and particularly relates to a substrate used for an III-V-nitride growth and a manufacturing method thereof.

Description of Related Arts

As a new highly-effective solid light source, the semiconductor illumination has advantages of long lifetime, energy saving, environmental protection and safety, etc., and the application area thereof is rapidly broadening. A core of the semiconductor illumination is a light-emitting diode (LED), that is a PN junction structurally formed by a III-V-compound such as GaAs (gallium arsenide), GaP (gallium phosphide), GaAsP (gallium arsenide phosphide), GaN (gallium nitride) semiconductor and the like. Therefore, the LED has an I-V characteristic of a general PN junction, i.e., forward-conductive, reverse-blocking and breakdown characteristics. In addition, the LED has a luminescence characteristic under certain conditions. Under forward voltages, electrons are implanted from an N region to a P region, while holes are implanted from the P region to the N region. A part of minority carriers entering a counterpart region are recombined with majority carriers for luminescence.

In order to improve luminous efficiency of the LED, generally, an active region of a quantum well is added between an n-type layer and a p-type layer of the PN junction, a luminous wavelength of the LED depends on the material of the quantum well and the PN junction of the LED and the width of the quantum well, while a GaN based III-V-nitride, comprising InGaN, AlGaN and the like, is an optimal material for preparing a visible LED. Most LEDs are prepared by using an epitaxial growth method, with a specific structure of successively grown N-type layer, active region, P-type layer on a substrate. Due to the lack of a cheap GaN homogeneous substrate, a GaN-based LED is generally grown on a foreign substrate, e.g., a Si, SiC or sapphirine substrate, etc., wherein the sapphirine substrate is most widely used.

It is very difficult to grow a high quality crystal material on a foreign substrate, let alone growing a device level GaN crystal material on the sapphirine substrate, until in the earlier 1990s, Japanese developed a two-step grown method to grow a device level GaN epitaxial layer by using a metal organic compound vapor deposition (MOCVD) method. Wherein, the so-called two-step grown method is that: firstly growing a GaN or AlGaN buffer layer with a thickness of about 30 nm on a surface of the sapphirine substrate at a growth temperature of about 500° C., then raising the growth temperature over 1000° C. to grow a high quality GaN epitaxial layer. A device prepared by such method has a large amount of dislocations, while the higher the dislocation density is, the lower luminous efficiency of the device is.

Currently, the most widely used so-called patterned sapphirine substrate (PSS) technology may reduce the dislocation density in the epitaxial layer, improve internal quantum efficiency of the LED, as well as improve light-extraction efficiency of the LED by diffuse scattering of the PPS patterns. A conventional PSS technology is to form various microscopic patterns on the surface of the sapphirine by using a photolithography process or an etching process. For example, a (0001) oriented surface of the sapphirine is formed with cone-shaped projections of a certain periodic structure, wherein the cone-shaped projections is still made of the sapphirine material, and there remains a certain area of (0001) crystal plane between the cone-shaped projections. Since there is a certain selective growth mechanism between the surface of the cone-shaped projections and the (0001) crystal plane between the cone-shaped projections, that is, during the epitaxial growth, the nucleation probability on the (0001) crystal plane between the cone-shaped projections is larger than that on the surfaces of the cone-shaped projections, and the epitaxial layer on the cone-shaped projection is generally formed by lateral growth, as a result, the epitaxial growth on the PSS substrate has a lateral growth effect, which may reduce the dislocation density in the epitaxial layer and improve the internal quantum efficiency of the LED using the PSS substrate. On the other hand, the microscopic structure of the surface of the PSS substrate has a certain diffuse scattering effect on emitted light by the LED, which is destructive to total reflection, and accordingly, the PSS substrate enables to improve the light-extraction efficiency of the LED. The foregoing two-step method is also available for growing a LED epitaxial structure on a conventional PSS substrate.

The conventional PSS technology has many disadvantages. Firstly, the sapphirine has great difficulty in manufacturing no matter by using a wet method or a dry method, thereby not only affecting production yield of the conventional PPS, but also increasing manufacturing cost; secondly, since the growth selectivity is not apparent between the surface of the cone-shaped projections of the sapphirine and the (0001) crystal plane between cone-shaped projections, the surface of the cone-shaped projection will nucleate if the area of the (0001) crystal plane between cone-shaped projections is too small, besides, since the crystal orientation of the crystal nucleus formed on the surface of the cone-shaped projection differs from the crystal orientation of the crystal nucleus formed on the (0001) crystal plane between cone-shaped projections, generation of polycrystal is easily caused; thirdly, since the sapphirine substrate has a relative large refractive index, which is about 1.8, even if a protrusion structure is formed on the its surface, it is not optimal for the diffuse scattering effect of the emitted light by the LED, and the improvement of the light-extraction efficiency is also limited.

An epitaxial lateral overgrowth (ELO) technology is to form a dielectric mask on a high quality GaN epitaxial layer with a thickness of the order of micrometers, followed by a second epitaxial growth to obtain GaN with relative low dislocation density. The high quality GaN epitaxial layer has a single crystal structure and incurs high production cost. Moreover, the GaN between the dielectric pattern and the sapphirine surface having a thickness larger than 1 micron may affect the diffuse scattering effect, and the GaN with a thickness larger than 1 micron may also affect consistency and reproducibility of the device.

It has been reported in articles to directly form a dielectric layer pattern on the surface of the sapphirine substrate for epitaxial growth, but the growth window is very small, and thus there is no value of mass production.

Currently, there is a technology to sputter a layer of aluminium nitride (AlN) with a certain crystal orientation on a conventional PSS, which is different from the above technology and the price/performance ratio of which is also lower than that of the above technology.

Therefore, it is desirable to provide a novel pattern substrate and a manufacturing method thereof to effectively improve the crystalline quality of the GaN based epitaxial layer and the LED epitaxial structure, e.g., reducing the dislocation density, and to improve various performance indexes of the LED, especially the luminous efficiency of the LED.

SUMMARY OF THE PRESENT INVENTION

In view of the above disadvantages in the prior art, an object of the invention is to provide a substrate used for III-V-nitride growth and a manufacturing method thereof, to solve the problem that the growth quality and the luminous flux of the light emitting diode are low in the prior art.

The invention provides a substrate used for III-V-nitride growth, at least comprising:

a growth substrate;

a buffer layer used for growing a subsequent luminescent epitaxial structure, wherein a lower surface of the buffer layer is combined with a surface of the growth substrate; and a plurality of semiconductor dielectric protrusions arranged at intervals on an upper surface of the buffer layer, bottom surfaces of the protrusions are combined with the upper surface of the buffer layer, and the buffer layer is exposed between protrusions.

The invention further provides a manufacturing method of the substrate used for III-V-nitride growth, at least comprising the following steps of:

1) providing a growth substrate, and forming on a surface of the growth substrate a buffer layer used for subsequent growth of a luminescent epitaxial structure;

2) forming a semiconductor dielectric layer on the surface of the buffer layer;

3) by means of a photolithography process, etching a plurality of protrusions arranged at intervals on the semiconductor dielectric layer, and exposing the buffer layer between the protrusions.

From the above, the invention provides a substrate used for III-V-nitride growth and a manufacturing method thereof. Because the novel patterned substrate uses a semiconductor dielectric layer as a mask, the effect of the selective growth is apparent, and thus it may enhance the quality of the epitaxial layer, reduce the dislocation density, improve the performance of the LED chip and enhance the internal quantum efficiency of the LED. Besides, the invention chooses the semiconductor dielectric layer with a relative small refractive index to manufacture the periodically arranged protrusion structure, which may enhance the reflection and scattering effects of the emitted light by the LED, as well as improve the luminescent efficiency of the LED.

Moreover, it is not necessary for the novel patterned substrate to adopt the two-step grown method to grow the LED epitaxial structure, but directly perform a high temperature growth, as a result, it may decrease the growth time of the LED epitaxial structure and reduce the epitaxial cost.

The manufacturing method of the invention is simple, advantageous for reducing cost of manufacture, and suitable for use in industrial production. To be specific, since the process of the semiconductor dielectric layer is a very common and conventional technology in the semiconductor technology, the process of the semiconductor dielectric layer is much easier than that of the sapphirine, the method is very compatible with the LED chip technology, easy for mass production and the preparation process window thereof is wider than that of a conventional PSS substrate, the photoetching and the product yield is high as well. The technology may increase capacity of the patterned substrate and reduce cost of the patterned substrate.

DESCRIPTION OF COMPONENT REFERENCE SIGNS

Figure 1:
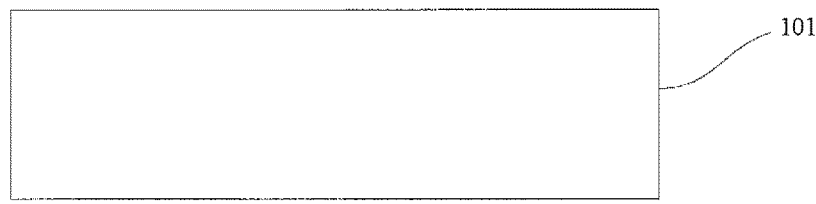
FIGS. 1 to 2 show schematic diagrams represented in step 1) of a substrate used for the III-V-nitride growth of the invention.

101 growth substrate
102 buffer layer
103 semiconductor dielectric layer
104 photoresist layer
105 photoresist piece
106 bump-shaped photoresist piece
107 semiconductor dielectric protrusion

DETAILED DESCRIPTION OF THE PREFERRED EMBODIMENTS

As a preferable solution of the substrate used for the III-V-nitride growth of the invention, the material of the growth substrate is one of sapphirine, SiC, Si and ZnO.

As a preferable solution of the substrate used for the III-V-nitride growth of the invention, the buffer layer has a thickness of 50-600 angstroms, preferably 100-500 angstroms, more preferably 200-400 angstroms. An excessively thin buffer layer cannot satisfy the nucleation requirement in the subsequent epitaxial growth, which causes the reduce of the growth quality of the epitaxial layer; an excessively thick buffer layer may cause an insufficient recrystallization of the buffer layer in the subsequent annealing process, which further affects the quality of the epitaxial layer; an excessively thick buffer layer may also affect the luminescent efficiency of the LED prepared on the substrate.

As a preferable solution of the substrate used for the III-V-nitride growth of the invention, the buffer layer is any of amorphous or polycrystalline materials of a hexagonal symmetrical structure crystal formed by anneal and recrystallization, and preferably selected from: $Al_xGa_{1-x}N$ prepared by a metal-organic chemical vapor deposition method with $0 \leq X \leq 0.5$, preferably $0 \leq X \leq 0.2$ and a preparation temperature range of 450-700° C., preferably 500-600° C.; AlN prepared by the metal-organic chemical vapor deposition method with a preparation temperature range of 700-1000° C.; an AlN layer prepared by a sputtering method with a (0001) crystal orientation; BN; or ZnO. The manufacturing method of the buffer layer is well-known by those skilled in the art, and is not further described herein.

Because the preparation temperature of the buffer layer is relative low, and the required thickness is relative small as well, it may effectively reduce the production cost while guaranteeing the nucleation growth of the subsequent luminescent epitaxial structure (especially the GaN based luminescent epitaxial structure). As compared to the low temperature $Al_xGa_{1-x}N$ layer, the preparation of the AlN layer by the sputtering method has the advantages of strong controllability of thickness, relative high degree of crystallographic orientation, and is advantageous for the nucleation growth of the luminescent epitaxial structure (especially the GaN based luminescent epitaxial structure).

As a preferable solution of the substrate used for the III-V-nitride growth of the invention, the semiconductor dielectric protrusion is at least one of $SiO_2$, SiN or SiON, and preferably $SiO_2$.

As a preferable solution of the substrate used for the III-V-nitride growth of the invention, the semiconductor dielectric protrusion has a height of 0.2-3 μm, and preferably 0.5-2 μm.

As a preferable solution of the substrate used for the III-V-nitride growth of the invention, the plurality of semiconductor dielectric protrusions are periodically arranged at intervals, the semiconductor dielectric protrusion has a bottom width of 0.3-4 μm and an interval of 0.1-2 μm. In principle, the smaller the bottom width of the semiconductor dielectric protrusion is, the smaller the interval is.

As a preferable solution of the substrate used for the III-V-nitride growth of the invention, the semiconductor dielectric protrusion is a semiconductor dielectric bump-shaped protrusion, semiconductor dielectric conoid-shaped protrusion or semiconductor dielectric pyramid-shaped protrusion. The bump-shaped protrusion with a relative flat surface may effectively improve the growth quality of the subsequent luminous epitaxial structure (especially the GaN based luminescent epitaxial structure), and is therefore preferred.

As a preferable solution of the substrate used for the III-V-nitride growth of the invention, the protrusion has a bottom surface connected with the upper surface of the buffer layer, a shape of the bottom surface is one of a polygon, triangle or circle or a combination thereof.

As a preferable solution of the substrate used for the III-V-nitride growth of the invention, the protrusion further has a top surface paralleling to the bottom surface, the top surface is one of a polygon, triangle or circle or a combination thereof.

As a preferable solution of the substrate used for the III-V-nitride growth of the invention, the top surface has a same shape with the bottom surface but a smaller area than the bottom surface.

As a preferable solution of the substrate used for the III-V-nitride growth of the invention, the top surface has a different shape with the bottom surface and a smaller area than the bottom surface.

As a preferable solution of the manufacturing method of the substrate used for the III-V-nitride growth of the invention, the material of the growth substrate is one of the sapphirine, SiC, Si and ZnO.

As a preferable solution of the manufacturing method of the substrate used for the III-V-nitride growth of the invention, the buffer layer has a thickness of 50-600 angstroms, preferably 100-500 angstroms, more preferably 200-400 angstroms.

As a preferable solution of the manufacturing method of the substrate used for the III-V-nitride growth of the invention, the buffer layer is any of amorphous or polycrystalline materials of a hexagonal symmetrical structure crystal formed by anneal and recrystallization, and more preferably selected from: $Al_xGa_{1-x}N$ prepared by the metal-organic chemical vapor deposition method with $0 \le X \le 0.5$, preferably $0 \le X \le 0.2$ and a preparation temperature range of 450-700° C., preferably 500-600° C.; AlN prepared by the metal-organic chemical vapor deposition method with a prepara-tion temperature range of 700-1000° C.; an AlN layer prepared by the sputtering method with a (0001) crystal orientation; BN; or ZnO.

As a preferable solution of the manufacturing method of the substrate used for the III-V-nitride growth of the invention, in step 2), a plasma enhanced chemical vapor deposition (PECVD) method is adopted to form a semiconductor dielectric layer on the buffer layer, wherein the dielectric material is at least one of $SiO_2$, SiN or SiON, and preferably $SiO_2$. In a preferable solution, the $SiO_2$ semiconductor dielectric layer is grown by using $SiH_4$ and $N_2O$ at a temperature range of 250-350° C. and under the plasma reaction environment by adopting the PECVD method.

As a preferable solution of the manufacturing method of the substrate used for the III-V-nitride growth of the invention, the semiconductor dielectric layer in step 2) has a thickness of 0.2-3 μm, and preferably 0.5-2 μm.

As for the manufacturing method of the substrate used for the III-V-nitride growth of the invention, etching the dielectric layer to a plurality of protrusions arranged at intervals in step 3) is a very common and conventional technology in the semiconductor process, and is well-known by those skilled in the art, and thus is not further described herein.

As a preferable solution of the manufacturing method of the substrate used for the III-V-nitride growth of the invention, the plurality of semiconductor dielectric protrusions are periodically arranged at intervals, the semiconductor dielectric protrusion has a bottom width of 0.3-4 μm and an interval of 0.1-2 μm. In principle, the smaller the bottom width of the semiconductor dielectric protrusion is, the smaller the interval is.

As a preferable solution of the manufacturing method of the substrate used for the III-V-nitride growth of the invention, the semiconductor dielectric protrusion in step 3) is a semiconductor dielectric bump-shaped protrusion, semiconductor dielectric conoid-shaped protrusion or semiconductor dielectric pyramid-shaped protrusion, and preferably a semiconductor dielectric bump-shaped protrusion.

As a preferable solution of the manufacturing method of the substrate used for the III-V-nitride growth of the invention, the protrusion has a bottom surface connected with the upper surface of the buffer layer, the bottom surface is one of a polygon, triangle or circle or a combination thereof.

Further, the semiconductor dielectric protrusion is the semiconductor dielectric bump-shaped protrusion, and the step 3) comprises steps of:

3-1) forming a photoresist layer on a surface of the semiconductor dielectric layer, making the photoresist layer into a plurality of photoresist pieces arranged at intervals;

3-2) reflowing the plurality of photoresist pieces into a plurality of bump-shaped photoresist pieces by using a heating-reflow process;

3-3) transferring the shape of each bump-shaped photoresist piece to the semiconductor dielectric layer by using an inductively coupled plasma etching method, to form a plurality of semiconductor dielectric bump-shaped protrusions and to expose the buffer layer between the semiconductor dielectric bump-shaped protrusions for the subsequent growth of the GaN based luminescent epitaxial structure.

Preferably, in the step 3-1), the photoresist layer may be made into a plurality of photoresist pieces arranged at intervals by using the exposure process or nano-imprint process, and the exposure process may be a stepper exposure or contact exposure.

EMBODIMENT

The embodiment modes of the present invention are described hereunder through specific examples, and persons skilled in the art may easily understand other advantages and efficacies of the present invention from the contents disclosed in the present description. The present invention may be further implemented or applied through other different specific embodiment modes, and various modifications or amendments may also be made to each of the details in the present description based on different perspectives and applications without departing from the spirit of the present invention.

Please refer to FIG. 1 to FIG. 7. It is to be noted that the drawings provided in the present embodiment only explain the basic conception of the present invention in an illustrative manner, so the drawings only display the components relevant to the present invention rather than being drawn according to the number, shape, size of the components and manufacturing method, process window during actual implementation, the shape, number and scale of each component may be randomly changed during its actual implementation, and the layout of the components thereof might also be more complicated. In the embodiments, the involved process conditions may be reasonably changed in the effective window to achieve the effect disclosed in the invention.

Embodiment 1

Figure 2:
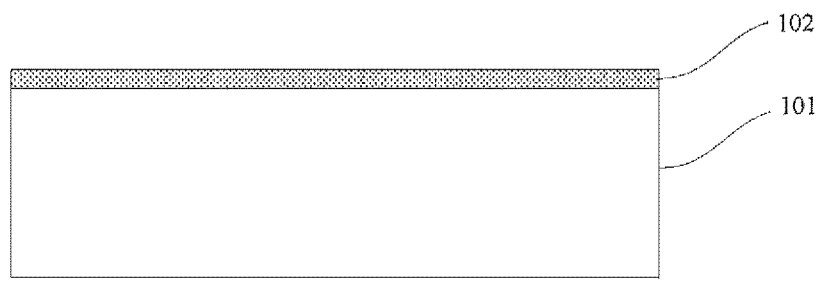

As shown in FIGS. 1 to 7, the embodiment provides a substrate used for GaN growth, and the manufacturing method thereof comprises the following steps of:

1. As shown in FIG. 1, in the embodiment, the growth substrate 101 is a commercially available flat type sapphirine substrate, wherein a surface thereof has a crystal orientation of (0001), and has an atomistic flatness. In the embodiment, a cleaning-free substrate is adopted without extra cleaning processes and can be used directly. The above substrate is placed on a graphite tray with a SiC protection layer and is sent to a MOCVD (metal organic chemical vapor phase deposition method) reaction chamber; the above substrate is heated to 1100° C. under an atmosphere of hydrogen, and kept for 10 minutes; after that, the temperature of the substrate is reduced to 550° C., the chamber is introduced with ammonia gas, trimethylaluminium (TMAl) and trimethyl gallium (TMGa) at the same time, wherein a normal flow rate of the ammonia gas is 56 L/minute, molar flow rates of the TMAl and TMGa are 3.25×10−5 and 2.47×10−4 mol/minute, respectively, a pressure of the reaction chamber is 500 torr, and the introduction time is 215 seconds. As shown in FIG. 2, the $Al_xGa_{1-x}N$ buffer layer, with a thickness of 300 angstroms, is formed on the growth substrate 101 under the above conditions, wherein x=0.2.

Figure 3:
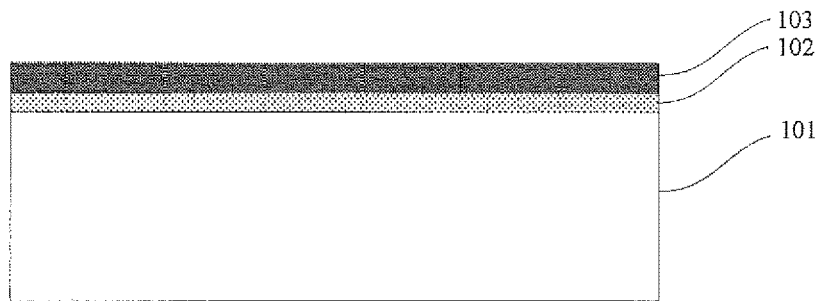
FIG. 3 shows a schematic diagram represented in step 2) of a manufacturing method of the substrate used for the III-V-nitride growth of the invention.

2. As shown in FIG. 3, after the growth of the buffer layer 102, a $SiO_2$ layer 103 with a thickness of 1 μm is formed on the buffer layer 102 by using the PECVD (plasma enhanced chemical vapor deposition) method. The PECVD reaction chamber has a temperature of 350° C. and a pressure of 1 torr (a standard atmospheric pressure is 760 torr), flow rates of the $SiH_4$ and $N_2O$ are 10 sccm and 300 sccm, respectively, radio frequency power is 30 W.

3. Formation of the medium layer pattern. As shown in FIGS. 4 to 7, the formed pattern is formed by periodically and spatially arranged $SiO_2$ protrusions, with an arrangement manner of hexagonal close-packed structure and a period of 3 μm, the $SiO_2$ protrusion has a bottom width of 2 μm and an interval of 1 μm.

Figure 4:
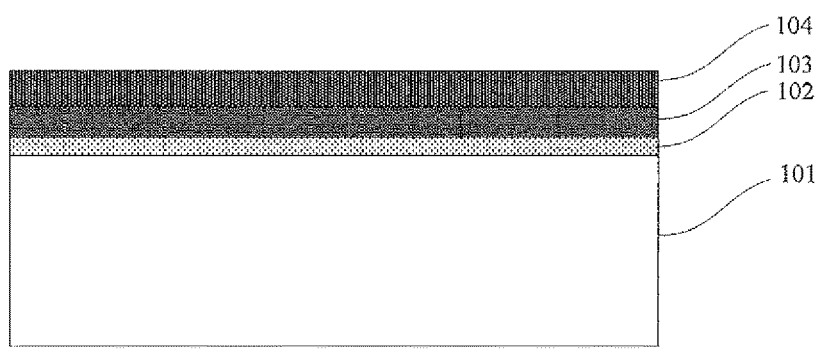
FIGS. 4 to 7 show schematic diagrams represented in step 3) of the manufacturing method of the substrate used for the III-V-nitride growth of the invention.
Figure 5:
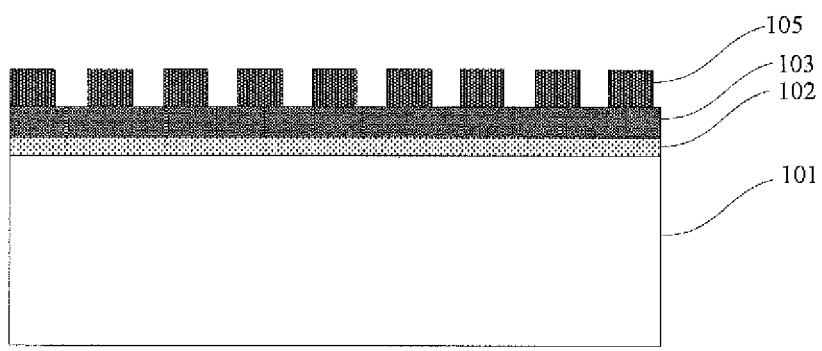

To be specific, the step 3) comprises the following steps of:

As shown in FIGS. 4 and 5, firstly performing step 3-1), wherein a surface of the $SiO_2$ layer 103 is coated with a photoresist layer 104 of 1 μm, which is made into a photoresist cylinder 105 of a hexagonal close-packed arrangement manner by using an exposure process, the hexagonal close-packed structure has a period of 3 μm, the photoresist cylinder has a diameter of 2 μm and an interval of 1 μm.

Figure 6:
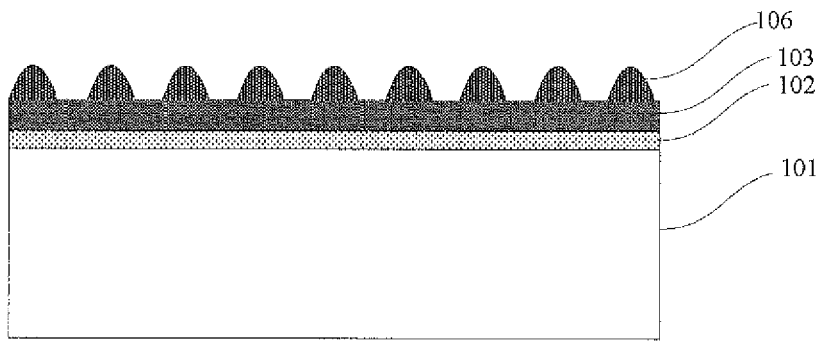

As shown in FIG. 6, then performing step 3-2), wherein the plurality of photoresist cylinders are reflown into a half ball by using a heating-reflow process, wherein a reflux temperature thereof is 130° C., and a reflux time thereof is 120 seconds.

Figure 7:
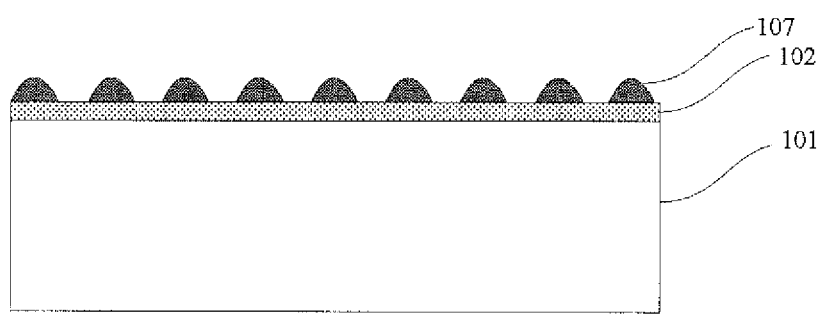

After that, as shown in FIG. 7, performing step 3-3): the half ball shaped photoresist patterns are transferred to the $SiO_2$ layer 103 by using an inductively coupled plasma (ICP) etching method, to form a plurality of $SiO_2$ bump-shape protrusions and expose the buffer layer 102 between the $SiO_2$ bump-shape protrusions, for the following epitaxial growth of the GaN epitaxial material. Processing conditions of the above ICP etching method is that: an etching gas is $CHF_3$ (fluoroform), and a normal flow rate thereof is 50 ml/min; the ICP has an upper electrode power of 1000 w and a lower electrode power of 50 w.

4. Finally, use acetone to clean residual photoresist on the $SiO_2$ surface, and use diluted hydrochloric acid to clean other contaminants on the surfaces of the $SiO_2$ protrusions and the exposed surface of the buffer layer for further epitaxial growth of the GaN.

By using the same MOCVD equipment, the GaN epitaxial layer with a thickness of 6 microns is respectively epitaxially grown on a patterned sapphirine substrate (PSS) and the novel patterned substrate prepared by the above steps of the invention. The specific growth conditions of the MOCVD is that: the growth temperature is 1050 degree, the heating and annealing time from the room temperature to the growth temperature is 15 minutes; the pressure of the reaction chamber is 500 torr, the normal flow rate of the ammonia gas is 56 L/min; the molar flow rate of the TMGa is 1.5e-3 mol/min, and the growth time is 150 minutes.

A XRD (X-ray double-crystal diffraction) spectrum is used to characterize the crystalline epitaxial layer quality, the smaller the half-width of the XRD spectrum is, the smaller the dislocation density of the crystalline epitaxial layer represents, and the higher the crystalline quality is. The testing results indicate that, the half-widths of the XRD (002) and (102) diffraction peaks of the GaN epitaxial layer grown on the conventional PSS substrate are 280 arc seconds and 302 arc seconds respectively, while the half-widths of the XRD (002) and (102) diffraction peaks of the GaN epitaxial layer grown on the prepared novel patterned substrate of the invention are 243 arc seconds and 258 arc seconds respectively. From the above experiments, it is apparent that the GaN epitaxial layer grown on the prepared novel patterned substrate by the above steps has better quality than the GaN epitaxial layer grown on the conventional PSS substrate.

Moreover, a measurement of the luminescent efficiency is performed on the LED devices grown on the two substrates. As compared to the conventional PSS substrate, the luminous efficiency of the LED prepared on the substrate of the invention is greatly improved. Average luminous flux of the packaged 3528 LED chip on the conventional PSS substrate is 18.30 lm; while the average luminous flux of the LED chip prepared on the substrate of the invention is 19.23 lm, the luminous efficiency thereof is improved by 5% or more.

Embodiment 2

As shown in FIGS. 1 to 7, the embodiment provides a manufacturing method of the substrate used for the GaN growth, and the basic steps are same as that in the embodiment 1, except that in the second step: the semiconductor medium layer 103 is a SiN layer prepared by using a PECVD method, wherein raw material for growing the SiN layer is $NH_3$ (ammonia gas) and $SiH_4$ (silane), the growth temperature is 400° C., the flow rate of $SiH_4$ is 20 sccm, the flow rate of $NH_3$ is 17 sccm, the flow rate of $N_2$ is 980 sccm, and the pressure is 0.8 torr.

By using the same MOCVD equipment, a GaN epitaxial layer with a thickness of 6 microns is respectively epitaxially grown on the conventional PSS substrate and the novel patterned substrate prepared by the above steps by using substantially same conditions. In the above experiments, the half-widths of the XRD (002) and (102) diffraction peaks of the GaN epitaxial layer grown on the conventional PSS substrate are 280 arc seconds and 302 arc seconds respectively, while the half-widths of the XRD (002) and (102) diffraction peaks of the GaN epitaxial layer grown on the prepared novel patterned substrate of the invention are 270 arc seconds and 283 arc seconds respectively. From the above experiments, it is apparent that the prepared novel patterned substrate in the invention has further advantage over the conventional PSS substrate.

Embodiment 3

As shown in FIGS. 1 to 6, the embodiment provides a manufacturing method of the substrate used for the GaN growth, with substantially same steps as in embodiment 1, wherein, the buffer layer 102 is an MN layer with a thickness of 200 angstroms prepared by using the physical vapor deposition (PVD) method, an adopted target is Al target, sputtering gas is $N_2$, a substrate temperature is 600° C., and a sputtering power is 600 W, The obtained AlN is a columnar polycrystal with a prominent crystal orientation arrangement of (0001).

By using the same MOCVD equipment, a GaN epitaxial layer with a thickness 6 microns is respectively epitaxially grown on the conventional PSS substrate and the novel patterned substrate prepared by the above steps by using substantially same conditions. In the above experiments, the half-widths of the XRD (002) and (102) diffraction peaks of the GaN epitaxial layer grown on the conventional PSS substrate are 280 arc seconds and 302 arc seconds respectively, while the half-widths of the XRD (002) and (102) diffraction peaks of the GaN epitaxial layer grown on the prepared novel patterned substrate of the invention are 237 arc seconds and 253 arc seconds respectively, From the above experiments, it is apparent that the prepared novel patterned substrate in the invention has further advantage over the conventional PSS substrate.

The abovementioned embodiments only illustratively describe the principle and efficacy of the present invention, rather than being used to limit the present invention. Any person skilled in the art may modify or amend the abovementioned embodiments without departing from the spirit and scope of the present invention. Thus, all equivalent modifications or amendments accomplished by persons having common knowledge in the technical field concerned without departing from the spirit and technical thoughts revealed by the present invention shall still be covered by the claims of the present invention.

What is claimed is:

1. A manufacturing method of a III-V-nitride semiconductor epitaxial wafer, comprising:
   1) providing a substrate;
   2) depositing an epitaxial buffer layer configured for growing a subsequent luminescent epitaxial structure on the substrate;
   3) depositing a layer of medium on the epitaxial buffer layer, patterning the medium layer to form a plurality of medium protrusions that are arranged spatially and to expose the epitaxial buffer layer between the medium protrusions;
   4) depositing an epitaxial transition layer on an exposed portion of the epitaxial buffer layer, until a thickness of the epitaxial transition layer is larger than a height of the medium protrusion;
   5) growing an epitaxial effective layer on an upper surface of the epitaxial transition layer, wherein the epitaxial effective layer comprises from bottom to top an n-type epitaxial layer, a luminous layer and a p-type epitaxial layer;
   wherein the medium protrusions in step 3) are formed by a following method:
      step 3-a), coating a surface of the medium layer with a photoresist layer, the photoresist layer being made into a plurality of photoresist cylinders using an exposure process;
      step 3-b), reflowing the plurality of photoresist cylinders into half balls by using a heating-reflow process; and
      step 3-c): transferring half ball shaped photoresist patterns to the epitaxial buffer layer by an inductively coupled plasma (ICP) etching method to form the plurality of medium protrusions and expose the epitaxial buffer layer between the medium protrusions for epitaxial growth of the subsequent luminescent epitaxial structure.

2. The method according to claim 1, wherein the method further comprises a step 3') between the steps 3) and 4), in which the substrate obtained in step 3) is annealed to form crystal nucleus at the exposed portion of the epitaxial buffer layer.

3. The method according to claim 1, wherein the substrate is formed by a material selected from a group consisting of $Al_2O_3$, SiC, Si, ZnO and GaN.

4. The method according to claim 1, wherein the epitaxial buffer layer has a thickness of 50-600 angstroms.

5. The method according to claim 1, wherein the epitaxial buffer layer is selected from a $Al_xGa_{1-x}N$ and a AlN layer with a crystal orientation of (0001), wherein $0 \leq x \leq 0.5$.

6. The method according to claim 1, wherein the medium protrusions have a height of 0.2-3 pm, and are formed by a material selected from a group consisting of $SiO_2$, SiN and SiON.

7. The method according to claim 1, wherein the epitaxial transition layer has a thickness of 0.5-10 µm, and is formed by a material selected from a group consisting of GaN, AlGaN, AlN, InGaN, and InAlGaN, and an n-type or p-type dopant thereof.

8. The method according to claim 1, wherein the epitaxial wafer comprises one selected from a group consisting of an n-type GaN layer, an InGaN multi-quantum well (MQW) luminous layer, and a p-type GaN layer.

* * * * *